(12) United States Patent
Kalter et al.

(10) Patent No.: US 6,730,529 B1
(45) Date of Patent: May 4, 2004

(54) METHOD FOR CHIP TESTING

(75) Inventors: Howard L. Kalter, Colchester, VT (US); H. Bernhard Pogge, Hopewell Junction, NY (US); George S. Prokop, Fishkill, NY (US); Donald L. Wheater, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 663 days.

(21) Appl. No.: 09/236,183

(22) Filed: Jan. 25, 1999

Related U.S. Application Data

(63) Continuation-in-part of application No. 08/827,207, filed on Mar. 28, 1997, now Pat. No. 5,899,703.

(51) Int. Cl.⁷ .......................... G01R 31/26; H01L 21/66
(52) U.S. Cl. ........................................... 438/17; 438/18
(58) Field of Search ...................................... 438/17, 18

(56) References Cited

U.S. PATENT DOCUMENTS 5,483,175 A * 1/1996 Ahmad et al.
5,593,903 A * 1/1997 Beckenbaugh et al.
5,899,703 A * 5/1999 Kalter et al.

* cited by examiner

*Primary Examiner*—George Fourson
*Assistant Examiner*—Michelle Estrada
(74) *Attorney, Agent, or Firm*—Tiffany L. Townsend

(57) ABSTRACT

Large area chip functionality is tested at an intermediate level in the manufacturing process. A process sequence is implemented in which a layer of insulator material is deposited over the chip. This layer is then processed to selectively open areas over existing vias which are to be used for chip level testing. The other vias remain covered with insulator. A sacrificial metal level is then deposited on the insulator layer and patterned to create adequately large test pad areas connected to exposed vias. This metal layer and the insulator layer covering the other buried vias are removed after testing to re-establish the full via set. As an extension to this basic test process, test circuits can be formed around or beside the chip to be tested in the kerf areas separating the chip from other chips on the semiconductor wafer. Connections to the test circuits is with a sacrificial metal layer over an insulator layer. The sacrificial metal layer and insulator layer are removed after testing. The test circuits are scribed off in the process of separating the chips after back end of line processing is completed.

6 Claims, 4 Drawing Sheets

METHOD FOR CHIP TESTING

This application is a continuation in part of U.S. patent application Ser. No. 08/827,207, filed Mar. 28, 1997, entitled "Method for chip Testing", now U.S Pat. No. 5,899,703, assigned to the present assignee and which is incorporated herein by reference.

BACKGROUND OF THE INVENTION

1. Field of the Invention

The present invention generally relates to a method for testing large area integrated circuit chips and, more particularly, to utilizing a sacrificial metal level to create adequate size test pads and subsequently, after testing, removing the sacrificial metal level in a planarization step prior to the next metal level deposition.

2. Background Description

Manufacturing processes of large area integrated circuit (IC) chips tend to produce poor yields. This, in turn, increases the costs of the chips. It is therefore desirable to increase the yields of large area IC chips. Yields of large area IC chips could be improved by testing chip functionality prior to deposition of final metal levels. To achieve adequate test capability at such an intermediate level in the manufacturing process, sufficiently large pads must be available; however, such pads would normally interfere with subsequently deposited metal levels and vias.

SUMMARY OF THE INVENTION

It is therefore an object of the present invention to provide a way to test chip functionality at an intermediate level of the manufacturing process.

It is another object of the invention to provide sufficiently large test pads for testing chip functionality at an intermediate level of the manufacturing process in a way that does not interfere with subsequently deposited metal levels and vias.

It is yet another object of the invention to increase large area chip yields and increase throughput.

According to the invention, a process sequence is implemented in which a layer of insulator material is deposited over exposed vias in an intermediate metallization level, covering all the exposed vias. This insulator layer is then processed to selectively open areas over selected vias which are to be used for electrical testing. Those vias not selected for testing purposes remain covered with insulator layer. A sacrificial metal layer is deposited on the surface of the insulator layer. The deposited sacrificial metal layer is pattern etched to create adequately large test pad areas connected to exposed vias. After the testing is done, the sacrificial metal layer and the insulator layer are removed, preferably by a chemical-mechanical polish (CMP). Other techniques for removing the metal layer and the insulator layer may also be used, such as for example initially interposing a delaminating material or an etch stop between the insulator layer and the chip. After removal of the sacrificial metal layer and the insulator layer, normal subsequent backend of line (BEOL) processing is performed to complete the manufacturing process.

As an extension to this basic test process, test circuits can be formed around or beside the chip to be tested in the kerf areas separating the chip from other chips on the semiconductor wafer. Connections to the test circuits are in the sacrificial metal layer used to form the test pads. These connections to the test circuits are removed in the same way, e.g., by CMP. The test circuits, being located in the kerf areas, are simply scribed off after testing or in the process of sawing the wafer to separate the chips.

BRIEF DESCRIPTION OF THE DRAWINGS

The foregoing and other objects, aspects and advantages will be better understood from the following detailed description of a preferred embodiment the invention with reference to the drawings, in which.

DETAILED DESCRIPTION OF PREFERRED EMBODIMENTS OF THE INVENTION

Figure 1:
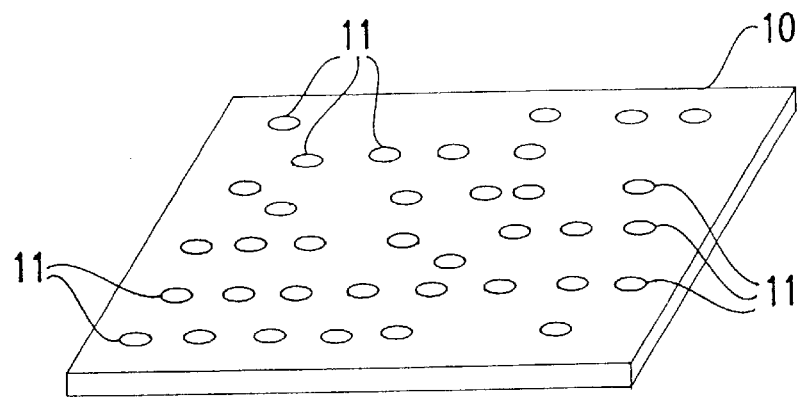
FIG. 1 is an isometric view showing a large area IC chip at an intermediate level in the manufacturing process.

Referring now to the drawings, and more particularly to FIG. 1, there is shown in isometric view a representation of a large area integrated circuit chip 10. This chip has been processed to an intermediate level in the manufacturing process. This intermediate level includes a metalization layer with a plurality of vias 11. These vias are too numerous and too small to allow chip level testing.

Figure 2:
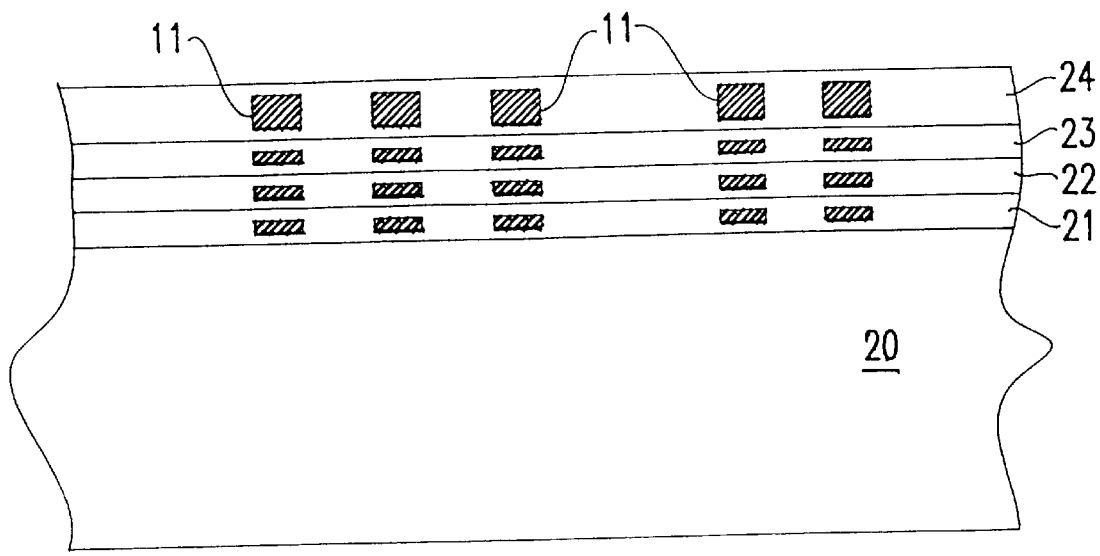
FIG. 2 is a cross-sectional view of the large area IC chip shown in FIG. 1.

A cross-sectional view of the chip at this intermediate level of the manufacturing process is shown in FIG. 2. In this example, there are four metalization layers 21 to 24 on a substrate 20. The number of layers is a function of specific circuit design and may be more or less than the four layers illustrated. Vias 11 extend through these metalization layers, making electrical contact between the several layers as appropriate to the design of the circuit.

Figure 4:
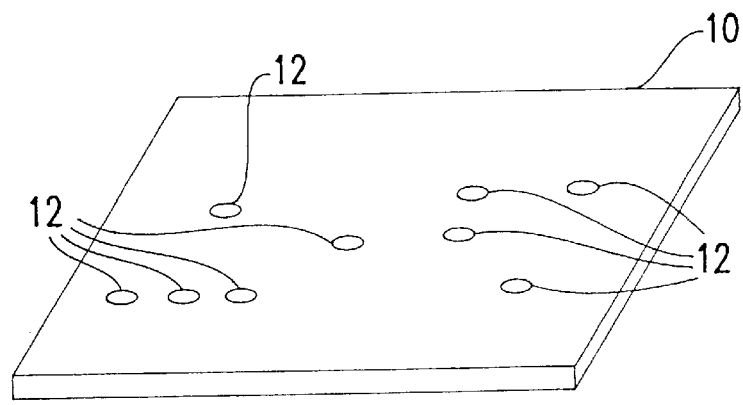
FIG. 4 is an isometric view showing the large area IC chip after an insulator layer has been applied and openings made in the insulator layer to selected vias for chip level testing.
Figure 5:
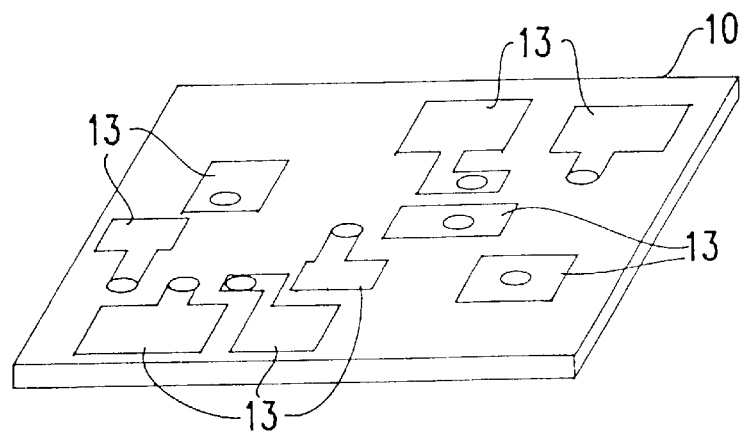
FIG. 5 is an isometric view showing the large are IC chip after application and patterning of the sacrificial metal layer to form test pads.
Figure 3:
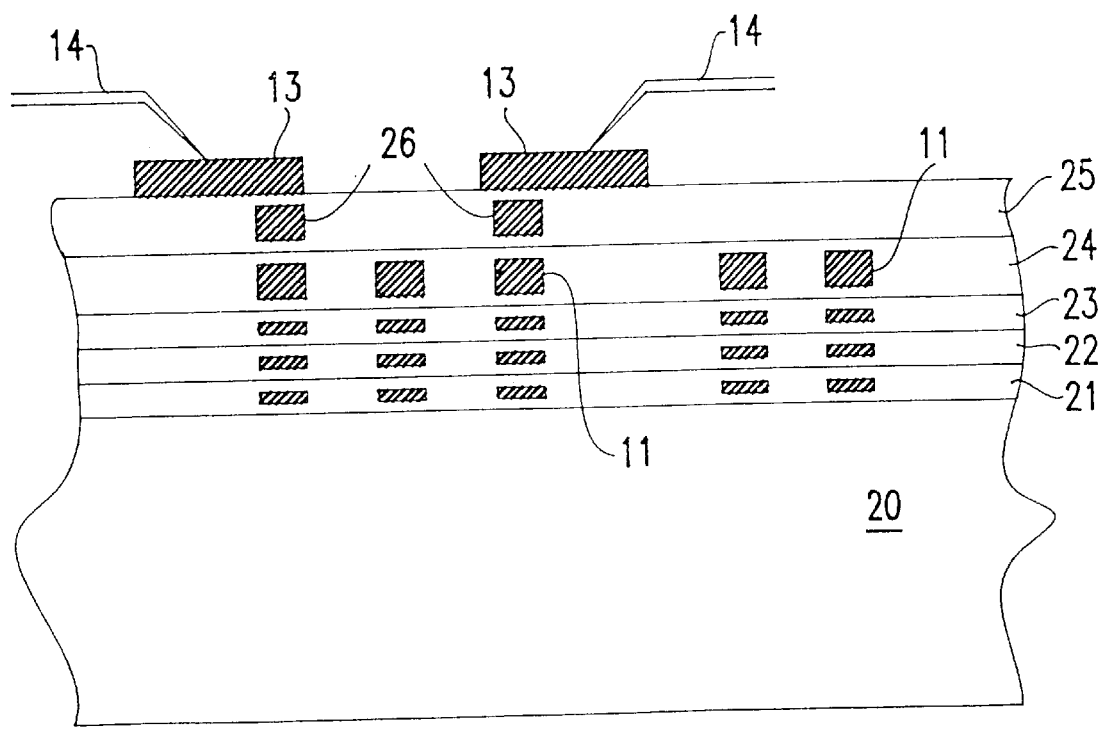
FIG. 3 is a cross-sectional view showing a large area IC with an insulator layer and sacrificial metal layer applied.

In order to test the chip at this intermediate level in the manufacturing process, an insulator layer 25 is applied over the uppermost metalization layer 24, as shown in FIG. 3, openings are formed in the insulator layer 25 revealing selected ones of the vias 11 for chip level testing. An isometric view of the chip at this point in the process is shown in FIG. 4 with openings 12. These openings are filled with a metal, forming vias 26 connected to the selected vias 11, as shown in FIG. 3. Test pads 13 connected to the vias 26 are patterned in a sacrificial metal layer deposited over the insulator layer 25. The cross-section of this structure is shown in FIG. 3 where test pads 13 are connected to vias 26 formed in the insulator layer 25. An isometric view of the chip with the test pads 13 formed on the insulator layer is shown in FIG. 5. These test pads are sufficiently large to enable contacting with test probes for chip level testing. Test probes 14 are shown in FIG. 3 making electrical contact with the test pads 13.

After the chip has passed the tests, it is subjected to a planarization step, such as a chemical-mechanical polish (CMP). This removes the test pads 13 and so much of the insulator layer 25 as to expose other vias not used in the chip level testing. The result of the CMP step is to bring the chip back to its original state shown in FIGS. 1 and 2. Alternate methods can also be used to remove the insulator layer and the sacrificial layer after testing. For example, a delaminating material or an etch stop can be interposed between the insulator layer and the top level of the chip.

Figure 6A:
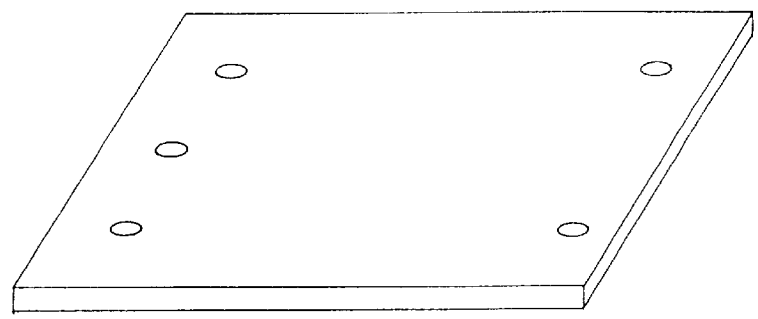
FIGS. 6A to 6C are isometric views illustrating the sequence of steps of applying and then removing sacrificial test pads according to the invention.
Figure 6B:
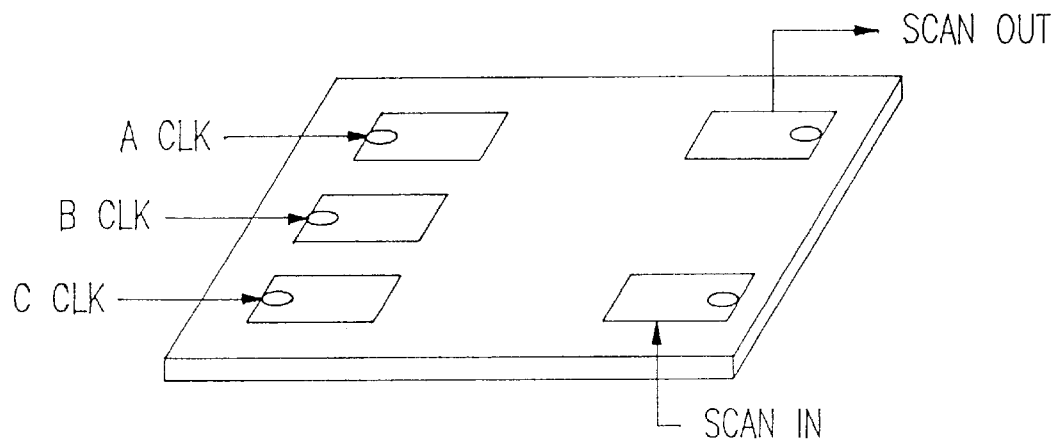
Figure 6C:
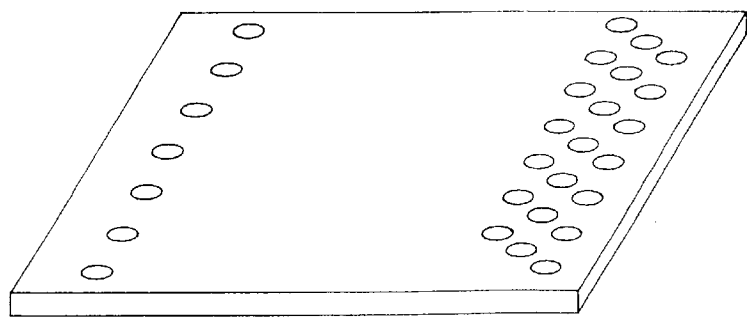

The process according to the present invention is summarized in FIGS. 6A, 6B and 6C which shows, in succession, (1) the chip with testable chip level vias exposed through the insulating layer at FIG. 6A, (2) the sacrificial test pads applied to the insulating layer and contacting the testable chip level vias in FIG. 6B, and (3) the chip after CMP in FIG. 6C with a multiplicity of exposed contact points.

The process described is useful for devices where there are fewer test points than connections to other chips. An example would be a memory macro with a wide input/output (I/O) capability that had level sensitive scan design (LSSD) or built-in self test (BIST). The process could also be applied to chips which have a number of test points equal in number to the number of connections.

Figure 7:
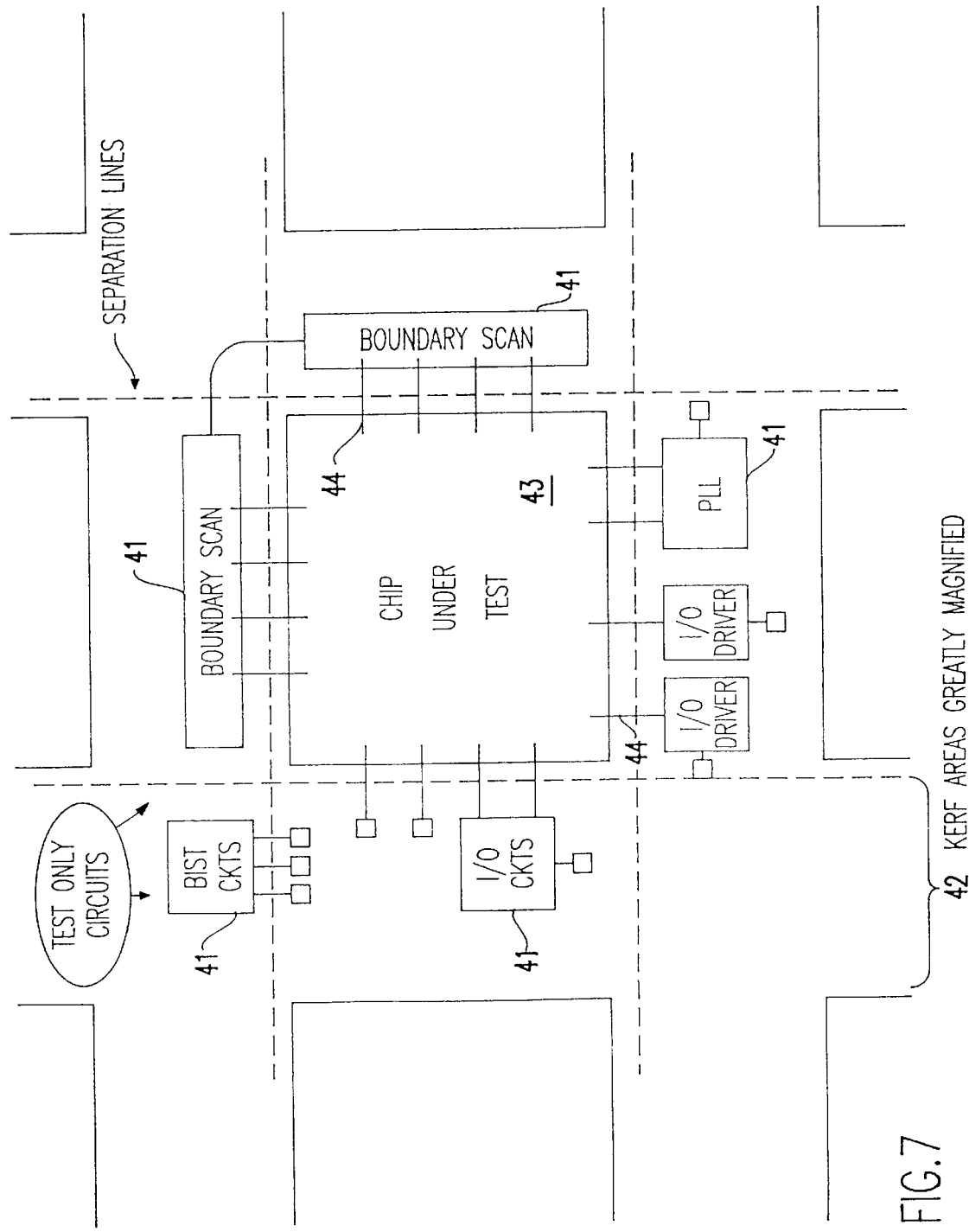
FIG. 7 is a plan view illustrating an extension of the basic invention to include test circuitry in the kerf areas separating chips on a semiconductor wafer.

As a further extension of the invention, test circuitry is added around or beside the chip to be tested, as shown in FIG. 7. This test circuitry 41 is formed in the kerf areas 42 separating chips 43 at the wafer level. Connections 44 to the test circuitry 41 is at the sacrificial metal level as described above for the test pads, (the test circuits could consist of test pads) and these connections would be removed in the same manner; e.g., by CMP. The test circuitry 41 would be scribed off after the test process in the separation of the chips. In some applications, the diced or separated chips are "reassembled" into a wafer, the ultimate result of which is larger chips after further processing. The combination of test pads and/or test circuits will be referred to as test structures.

The functions that can be performed by these test circuits include, but are not limited to, BIST (built-in self test) circuits to fully or partially perform tests for the associated chip, I/O cells to drive external tester functions for I/O that ultimately would only drive adjacent chips after the final processing steps (they would otherwise be unable to drive the loads presented by the tester and performance board at the speeds they could drive after completion of processing), circuits for performance testing of the device (time measurement and clock multiplying circuits, e.g., phase locked loops (PLLs)) and performance monitor circuits (ring oscillators, etc.), boundary scan latches, and analog test circuitry to facilitate analog macro testing.

While the invention has been described in terms of preferred embodiments, those skilled in the art will recognize that the invention can be practiced with modification within the spirit and scope of the appended claims.

What is claimed is:

1. A method of integrated circuit chips, comprising the steps of:

forming an insulating layer over an integrated circuit chip;

selectively opening at least one area over existing vias;

forming a test circuit in kerf areas adjacent to the chip prior to separating the chip from other chips formed on a semiconductor wafer;

depositing a sacrificial metal layer over the insulating layer and filling the at least one selectively opened area, the sacrificial layer in direct contact with the integrated circuit chip;

patterning the deposited sacrificial metal layer to form at least one direct connection between the test circuit and an exposed via;

testing the integrated circuit chip with the test circuit;

removing substantially all of the sacrificial metal layer and removing the insulating layer.

2. The method of testing recited in claim 1 further comprising the step of scribing the wafer in the kerf areas to separate the chip and remove the test circuits.

3. The method of testing recited in claim 1 wherein the step of removing includes planarizing the integrated circuit chip to remove the sacrificial metal layer and at least an amount of the insulating layer.

4. The method of testing recited in claim 2 wherein the step of removing includes planarizing the integrated circuit chip to remove the sacrificial metal layer and a predetermined amount of the insulating layer.

5. The method of testing recited in claim 3 wherein the step of planarizing includes chemical-mechanical polishing the integrated circuit chip.

6. The method of testing recited in claim 4 wherein the step of planarizing includes chemical-mechanical polishing the integrated circuit chip.

* * * * *